(12) United States Patent
Park

(10) Patent No.: US 10,985,314 B2
(45) Date of Patent: Apr. 20, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventor: Il Mok Park, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 557 days.

(21) Appl. No.: 15/862,885

(22) Filed: Jan. 5, 2018

(65) Prior Publication Data

US 2018/0287055 A1    Oct. 4, 2018

(30) Foreign Application Priority Data

Mar. 31, 2017  (KR) .................. 10-2017-0041966

(51) Int. Cl.

| | | |
|---|---|---|
| *H01L 45/00* | (2006.01) | |
| *H01L 27/24* | (2006.01) | |
| *H01L 27/105* | (2006.01) | |
| *G11C 13/00* | (2006.01) | |

(52) U.S. Cl.
CPC .......... *H01L 45/06* (2013.01); *H01L 27/1052* (2013.01); *H01L 27/2427* (2013.01); *H01L 45/126* (2013.01); *H01L 45/1233* (2013.01); *H01L 45/144* (2013.01); *G11C 13/0004* (2013.01); *G11C 2213/52* (2013.01); *G11C 2213/76* (2013.01)

(58) Field of Classification Search
CPC ... H01L 45/06; H01L 46/1233; H01L 45/126; H01L 27/1052; H01L 27/2427; G11C 13/004; G11C 2213/52; G11C 2213/76
See application file for complete search history.

(56) References Cited

U.S. PATENT DOCUMENTS

| | | | |
|---|---|---|---|
| 6,475,912 B1* | 11/2002 | Harada | ............ H01L 21/76843 |
| | | | 438/654 |
| 6,764,894 B2 | 7/2004 | Lowrey | |
| 7,135,696 B2 | 11/2006 | Karpov et al. | |
| 7,211,819 B2 | 5/2007 | Karpov | |
| 8,278,206 B2 | 10/2012 | Oh et al. | |

(Continued)

FOREIGN PATENT DOCUMENTS

| | | |
|---|---|---|
| KR | 10-2010-0048198 A | 5/2010 |
| KR | 10-2011-0007230 A | 1/2011 |
| KR | 10-1486984 B1 | 1/2015 |

*Primary Examiner* — Mark W Tornow
*Assistant Examiner* — Abbigale A Boyle
(74) *Attorney, Agent, or Firm* — Lee IP Law, P.C.

(57) ABSTRACT

A semiconductor device includes a first word line, a first bit line, a mold film, and a first memory cell. The first bit line crosses a direction of the first word line and is spaced from the first word line. The mold film fills space between the first word line and the first bit line. The first memory cell is in the mold film and between the first word line and the first bit line. The first memory cell includes a first lower electrode on the first word line, a first phase-change film on the first lower electrode, a first intermediate electrode on the first phase-change film, a first ovonic threshold switch (OTS) on the first intermediate electrode, and a first upper electrode between the first OTS and the first bit line. A resistivity of the first lower electrode ranges from about 1 to about 30 mΩ·cm.

17 Claims, 23 Drawing Sheets

(56) References Cited

U.S. PATENT DOCUMENTS

| | | | |
|---|---|---|---|
| 8,507,353 B2 * | 8/2013 | Oh | H01L 27/2463 |
| | | | 257/E21.004 |
| 8,558,348 B2 | 10/2013 | Oh et al. | |
| 9,166,158 B2 | 10/2015 | Lengade et al. | |
| 9,190,610 B2 | 11/2015 | Liang et al. | |
| 2005/0032307 A1 | 2/2005 | Karpov | |
| 2009/0275198 A1 | 11/2009 | Kamepalli et al. | |

* cited by examiner

US 10,985,314 B2

SEMICONDUCTOR DEVICE AND METHOD FOR FABRICATING THE SAME

CROSS-REFERENCE TO RELATED APPLICATION

Korean Patent Application No. 10-2017-0041966, filed on Mar. 31, 2017, and entitled, "Semiconductor Device and Method for Fabricating the Same," is incorporated by reference herein in its entirety.

BACKGROUND

1. Field

One or more embodiments described herein relate to a semiconductor device and a method for fabricating a semiconductor device.

2. Description of the Related Art

A variety of semiconductor memory devices have been developed. A volatile semiconductor memory device loses stored information when power is interrupted. A nonvolatile semiconductor memory device retains stored information even when power is interrupted. A flash memory device having a stacked gate structure is frequently employed as a non-volatile memory device.

Recently, a non-volatile memory device using a resistance material has been proposed to replace flash memory devices. One type of non-volatile memory device that uses resistance material is a phase-change random access memory (PRAM). This type of memory includes a phase-change material that is heated upon application of write current and cooled down to transform to a crystalline state or an amorphous state. In driving a phase-change memory device, the magnitude of the write current that makes the phase-change material amorphous consumes a large amount of power.

SUMMARY

In accordance with one or more embodiments, a semiconductor device includes a first word line extending in a first direction; a first bit line extending in a second direction crossing the first direction and spaced apart from the first word line in a third direction crossing the first and second directions; a first memory cell that extends in the third direction between the first word line and the first bit line, wherein the first memory cell includes: a first lower electrode on the first word line, a first phase-change film on the first lower electrode, a first intermediate electrode on the first phase-change film, a first switch on the first intermediate electrode, and a first upper electrode on the first switch, and wherein a resistivity of the first lower electrode ranges from about 1 to about 30 mΩ·cm.

In accordance with one or other more embodiments, a semiconductor device includes a first word line extending in a first direction; a second word line extending in the first direction and parallel with the first word line above the first word line; a first bit line extending in a second direction intersecting the first direction and between the first and second word lines; a first memory cell oriented in a vertical direction between the first word line and the first bit line. The first memory cell includes a first lower electrode on the first word line, a first phase-change film on the first lower electrode, a first OTS on the first phase-change film, and a first upper electrode between the first OTS and the first bit line, wherein a resistivity of the first lower electrode ranges from about 1 to about 30 mΩ·cm; and a second memory cell oriented in a vertical direction between the second word line and the first bit line, wherein the second memory cell includes a second lower electrode on the first bit line, a second phase-change film on the second lower electrode, a second OTS on the second phase-change film, and a second upper electrode between the second OTS and the second word line, wherein a resistivity of the second lower electrode ranges from about 1 to about 30 mΩ·cm.

In accordance with one or other more embodiments, a semiconductor device includes a first word line extending in a first direction; a first bit line extending in a second direction crossing the first direction and spaced apart from the first word line in a third direction crossing the first and second directions; a second bit line at a same level with the first bit line and spaced apart from the first bit line in the first direction; a first memory cell formed in the third direction between the first word line and the first bit line.

The first memory cell includes a first lower electrode on the first word line, a first phase-change film on the first lower electrode, a first intermediate electrode on the first phase-change film, a first OTS on the first intermediate electrode, and a first upper electrode interposed between the first OTS and the first bit line, wherein the first lower electrode comprises TiSiN with Si content of about 5 to about 55 at. %; and a second memory cell oriented in the third direction between the first word line and the second bit line.

The second memory cell includes a second lower electrode on the first word line, a second phase-change film on the second lower electrode, a second intermediate electrode on the second phase-change film, a second OTS on the second intermediate electrode, and a second upper electrode between the second OTS and the second bit line, wherein the second lower electrode includes TiSiN with Si content of about 5 to about 55 at. %.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
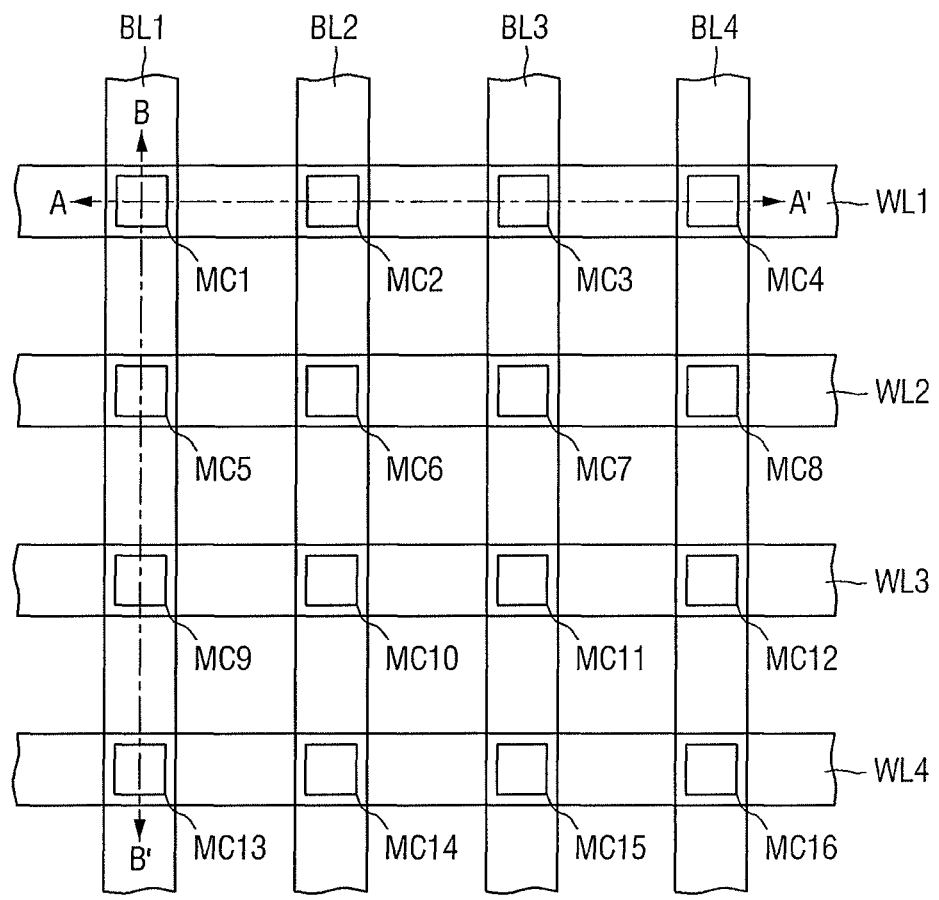
FIG. 1 illustrates a layout embodiment of a semiconductor device.
Figure 1:
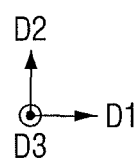
Figure 2:
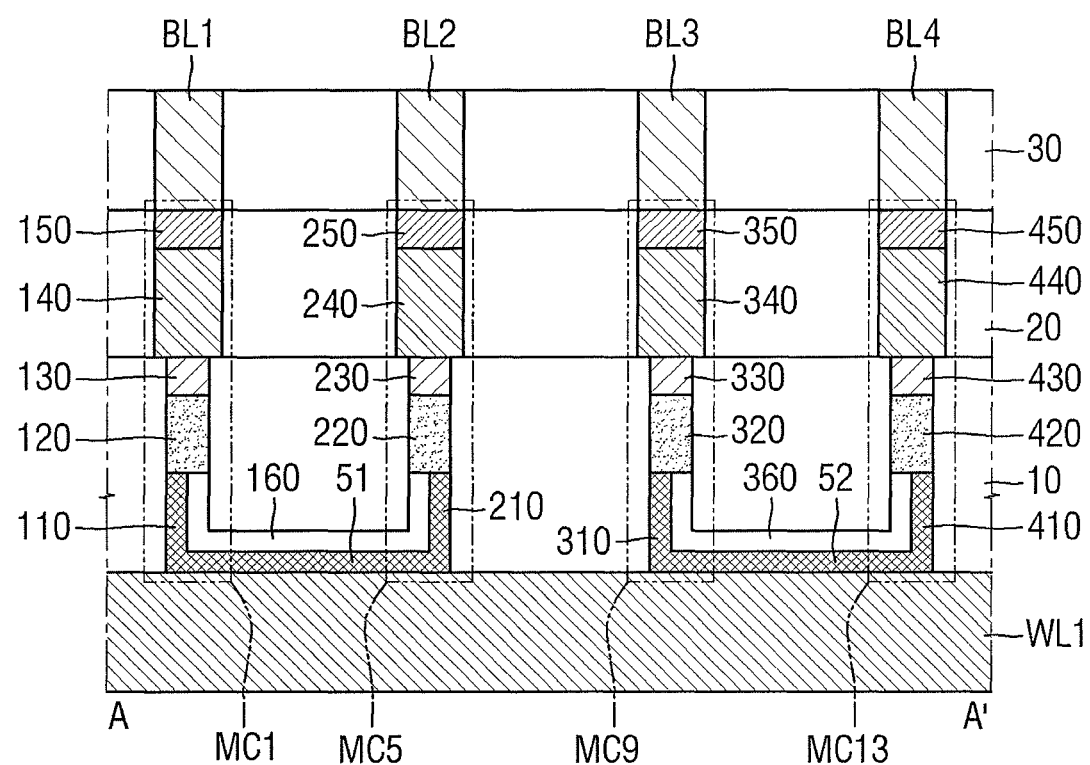
FIG. 2 illustrates a view along section line A-A' in FIG. 1.
Figure 3:
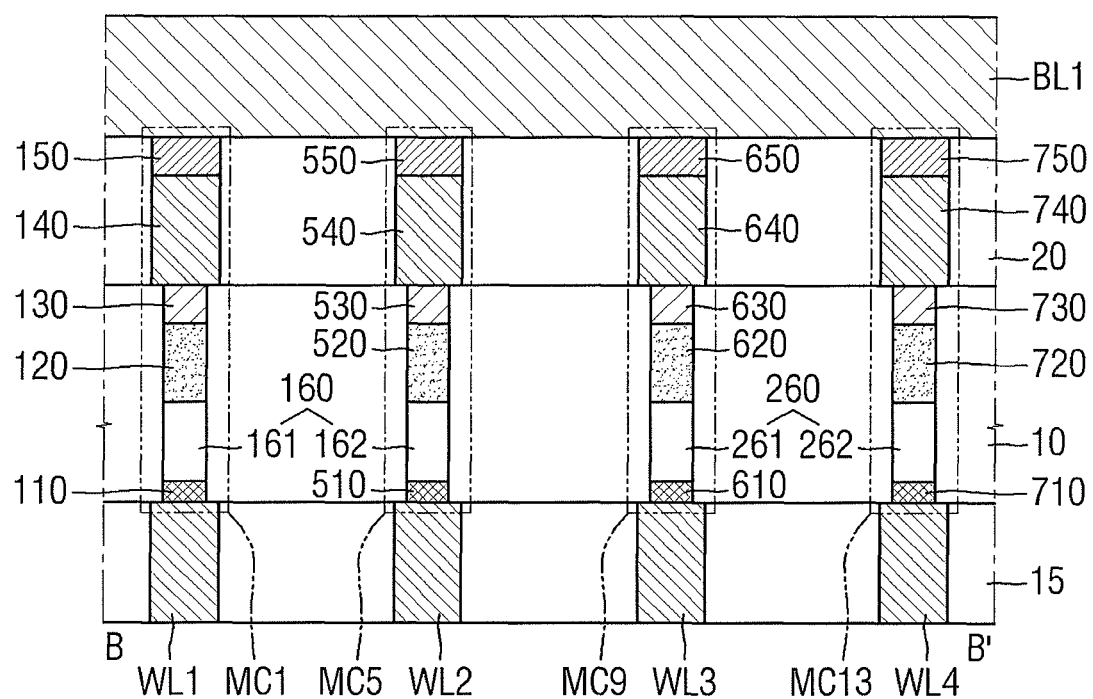
FIG. 3 illustrates a view along line B-B' in FIG. 1.

FIG. 1 illustrates a layout embodiment of a semiconductor device. FIG. 2 illustrates a cross-sectional view taken along line A-A' in FIG. 1. FIG. 3 illustrates a cross-sectional view taken along line B-B' in FIG. 1.

Referring to FIGS. 1 to 3, the semiconductor device includes first to fourth word lines WL1 to WL4, first to fourth bit lines BL1 to BL4, first to sixteenth memory cells MC1 to MC16, and first to third mold films 10 to 30. The number of elements shown in the figures may be different in another embodiment.

The first to fourth word lines WL1 to WL4 may extend in a first direction D1. The first to fourth word lines WL1 to WL4 may be spaced apart from one another in a second direction D2. The first to fourth word lines WL1 to WL4 may extend in parallel and at the same height level. For example, the second word line WL2 may be between the first word line WL1 and the third word line WL3. The third word line WL3 may be between the second word line WL2 and the fourth word line WL4.

The first to fourth word lines WL1 to WL4 may include conductors. For example, the first to fourth word lines WL1 to WL4 may include, but is not limited to, a metal such as tungsten (W), platinum (Pt), palladium (Pd), rhodium (Rh), ruthenium (Ru), iridium (Ir), copper (Cu), aluminum (Al), titanium (Ti), or tantalum (Ta).

A lower mold film 15 may fill spaces between the first to fourth word lines WL1 to WL4, which are spaced apart from one another in the second direction. The lower mold film 15 may surround the first to fourth word lines WL1 to WL4. The top surface of the lower mold film 15 may be flush with top surfaces of the first to fourth word lines WL1 to WL4. The lower mold film 15 may include, for example, an insulating film, e.g., at least one of SiN, $SiO_2$ and Si.

The first to fourth bit lines BL1 to BL4 may be above the first to fourth word lines WL1 to WL4. The first to fourth bit lines BL1 to BL4 may extend in the first direction D1 in parallel.

The first to fourth bit lines BL1 to BL4 may extend in the second direction D2. The first to fourth bit lines BL1 to BL4 may be spaced apart from one another in the first direction D1. Accordingly, the first to fourth word lines WL1 to WL4 and the first to fourth bit lines BL1 to BL4 may form a mesh structure when viewed from above.

For example, the second bit line BL2 is between the first bit line BL1 and the third bit line BL3. The third bit line BL3 may be between the second bit line BL2 and the fourth bit line BL4. The first to fourth bit lines BL1 to BL4 may intersect the first to fourth word lines WL1 to W1A, respectively at right angle.

In one embodiment, the first to fourth bit lines BL1 to BL4 may form an acute angle with the first to fourth word lines WL1 to WL4, respectively. The first to fourth bit lines BL1 to BL4 may include conductors. For example, the first to fourth bit lines BL1 to BL4 may include, but is not limited to, a metal such as tungsten (W), platinum (Pt), palladium (Pd), rhodium (Rh), ruthenium (Ru), iridium (Ir), copper (Cu), aluminum (Al), titanium (Ti), or tantalum (Ta).

An upper mold film 30 may fill the spaces between the first to fourth bit lines BL1 to BL4, which are spaced apart from one another in the first direction. The upper mold film 30 may surround the first to fourth bit lines BL1 to BL4. The top surface of the upper mold film 30 may be flush with top surfaces of the first to fourth word lines WL1 to WL4.

Each of the first to sixteenth memory cells MC1 to MC16 may be in contact with one of the first to fourth word lines WL1 to WL4 and one of the first to fourth bit lines BL1 to BL4. For example, the bottom surface of the first memory cell MC1 may be in contact with the first word line WL1, and the top surface of the first memory cell MC1 may be in contact with the first bit line BL1.

Likewise, the bottom surface of the second memory cell MC2 may be in contact with the first word line WL1. The top surface of the second memory cell MC2 may be in contact with the second bit line BL2. The bottom surface of the third memory cell MC3 may be in contact with the first word line WL1. The top surface of the third memory cell MC3 may be in contact with the third bit line BL3. The bottom surface of the fourth memory cell MC4 may be in contact with the first word line WL1. The top surface of the fourth memory cell MC4 may be in contact with the fourth bit line BL4.

In addition, as shown in FIG. 3, the bottom surface of the fifth memory cell MC5 may be in contact with the second word line WL1. The top surface of the fifth memory cell MC5 may be in contact with the first bit line BL1. The bottom surface of the ninth memory cell MC9 may be in contact with the third word line WL3. The top surface of the ninth memory cell MC9 may be in contact with the fourth bit line BL1. The bottom surface of the thirteenth memory cell MC13 may be in contact with the fourth word line WL4. The top surface of the thirteenth memory cell MC13 may be in contact with the first bit line BL1.

For each of the other memory cells not shown in FIGS. 2 and 3, the bottom surface thereof may be in contact with one of the first to fourth word lines WL1 to WL4. The top surface thereof may be in contact with one of the first to fourth bit lines BL1 to BL4.

As shown in FIG. 1, each of the first to sixteenth memory cells MC1 to MC16 may be at the respective intersections between the first to fourth word lines WL1 to WL4 and the first to fourth bit lines BL1 to BL4. Such memory cell structure is referred to as a crosspoint structure.

The first to fourth memory cells MC1 to MC4 may extend from the first to fourth bit lines BL1 to BL4, respectively, to the first word line WL1 in the third direction D3. The fifth to eighth memory cells MC5 to MC8 may extend from the first to fourth bit lines BL1 to BL4, respectively, to the second word line WL2 in the third direction D3. The ninth to twelfth memory cells MC9 to MC12 may extend from the first to fourth bit lines BL1 to BL4, respectively, to the third word line WL3 in the third direction D3. The thirteenth to sixteenth memory cells MC13 to MC16 may extend from the first to fourth bit lines BL1 to BL4, respectively, to the fourth word line WL4 in the third direction D3.

The first memory cell MC1 may include a first lower electrode 110, a first phase-change film 120, a first intermediate electrode 130, a first OTS 140, and a first upper electrode 150.

The first lower electrode 110 may be on the top surface of the first word line WL1. The first lower electrode 110 may be in direct contact with the top surface of the first word line WL1. The first lower electrode 110 may be the lowermost layer of the first memory cell MC1 and thus the bottom surface of the first lower electrode 110 may be the bottom surface of the first memory cell MC1.

The first lower electrode 110 may include a conductor. For example, the first lower electrode 110 may include at least one of W, Ti, Al, Cu, C, CN, TiN, TiAlN, TiSiN, TiCN, WN, CoSiN, WSiN, TaN, TaCN or TaSiN. The first lower electrode 110 may function as a heater for applying heat to the first phase-change film 120.

In the semiconductor device according to some exemplary embodiments, the first lower electrode 110 may include material having a specific resistivity. For example, the first lower electrode 110 may include a material having a specific resistance of 5 to 55 mΩ·cm. In this regard, the characteristics of the first lower electrode 110 in the semiconductor device according to some exemplary embodiments will be described with reference to FIG. 4.

Figure 4:
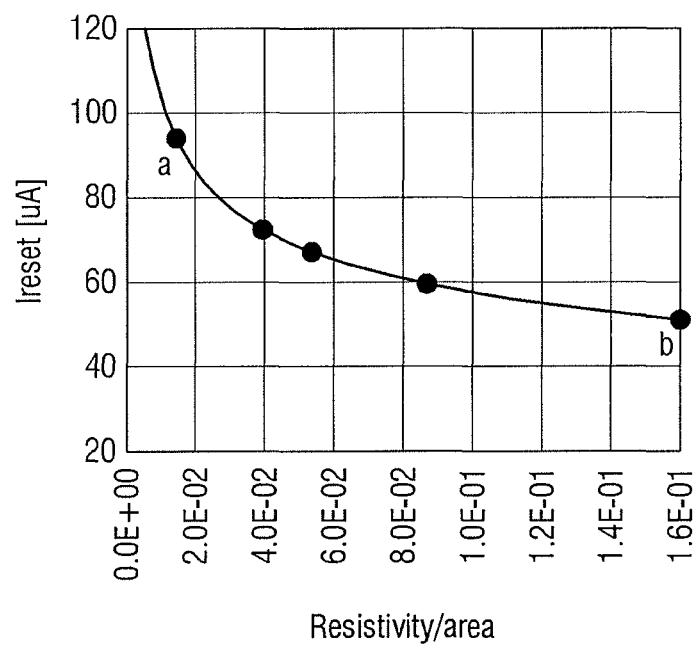
FIG. 4 illustrates an example of operation characteristics of an embodiment of a semiconductor device.

FIG. 4 illustrates a graph of example operation characteristics of the semiconductor device. In FIG. 4, the horizontal axis represents resistivity of the material of the first lower electrode 110 and the vertical axis represents the value of the write current $I_{reset}$ flowing through the first lower electrode 110. As shown in FIG. 4, there is a negative correlation between the value of the resistivity of the material of the first lower electrode 110 and the value of the write current flowing through the first lower electrode 110.

In some exemplary embodiments, the value of the write current $I_{reset}$ for phase-changing the first phase-change film 120 from crystalline to amorphous state may be 55 μA to 95 μA. The current consumed by the first memory cell MC1 when the write current in the above range flows therein (that is, in the write operation) may be, for example, approximately 82.5 μW to 152 μW.

When the current flowing through the first lower electrode 110 during the write operation of the first memory cell MC1 is less than 55 μA, the Joule heat generated at the interface between the first lower electrode 110 and the first phase-change film 120 is relatively small. As a result, a phase-change of the first phase-change film 120 may not be appropriately carried out. Also, if the value of the current flowing through the first lower electrode 110 during the write operation of the first memory cell MC1 is greater than 95 μA, the semiconductor device according to the exemplary embodiment may consume too much power.

Accordingly, in the semiconductor device according to some exemplary embodiments, the first lower electrode 110 may have a resistivity in the range from 1 to 30 mΩ·cm. When the first lower electrode 110 has a resistivity within the above range, the write current flowing through the first lower electrode 110 may have a magnitude in the range from 55 μA to 95 μA, and the first memory cell MC 1 may perform the write operation within the electric energy of the target range.

For example, when the first lower electrode 110 has the resistivity of 1 mΩ·cm, the value of the write current flowing through the first lower electrode 110 during the write operation of the first memory cell MC1 may be approximately 95 μA. When the first lower electrode 110 has the resistivity of 30 mΩ·cm, the value of the write current flowing through the first lower electrode 110 during the write operation of the first memory cell MC1 may be approximately 55 μA.

As described above, the first lower electrode 110 may include a conductor. In the semiconductor device according to some exemplary embodiments, the first lower electrode 110 may include, for example, TiSiN. When the first lower electrode 110 includes TiSiN, resistivity of the first lower electrode 110 may vary depending on the concentration of Si atoms in TiSiN.

Figure 5:
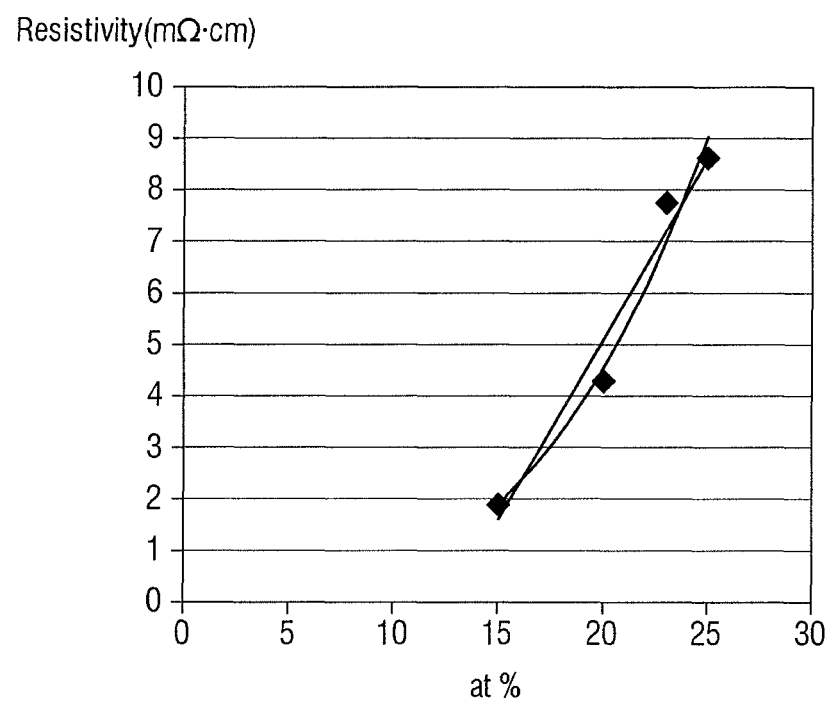
FIG. 5 illustrates an example of characteristics of an embodiment of a semiconductor device.

FIG. 5 illustrates a graph of other example operation characteristics of the semiconductor device. In FIG. 5, the horizontal axis represents the atomic concentration of Si when the first lower electrode 110 includes TiSiN. The vertical axis represents the resistivity of the first lower electrode 110. As shown in FIG. 5, there is a positive correlation between the concentration of Si atoms contained in the first lower electrode 110 and the resistivity of the first lower electrode 110.

Example values of the Si concentration and resistivity of the first lower electrode shown in FIG. 5 are in Table 1.

TABLE 1

| Si content (at. %) | 15 | 20 | 23 | 25 |
|---|---|---|---|---|
| Resistivity (mΩ · cm) | 1.93 | 4.29 | 7.74 | 8.64 |

Thus, when the first lower electrode 110 contains TiSiN as the electrode material, the content of Si to have a resistivity of 1 to 30 mΩ·cm may range from 5 to 55 at. %.

Referring again to FIGS. 1 to 3, a first phase-change film 120 may be on the first lower electrode 110. The first phase-change film 120 may be on the top surface of the first lower electrode 110. The first phase-change film 120 may be in direct contact with the top surface of the first lower electrode 110.

The first phase-change film 120 may include a variety of kinds of materials including, but not limited to, binary compound such as GaSb, InSb, InSe, SbTe and GeTe, ternary compound such as GeTeAs, GeSbTe, GeBiTe, GaSeTe, SeTeSn, GeTeTi, InSbTe, SnSb$_2$Te$_4$ and InSbGe, and quaternary compound such as AgInSbTe, (GeSn)SbTe, GeSb(SeTe) and Te$_{81}$Ge$_{15}$Sb$_2$S$_2$. In addition, the above materials may be doped with nitrogen (N), silicon (Si), carbon (C) or oxygen (O) to improve the semiconductor properties of the first phase-change film 120. For example, GeSbTe doped with nitrogen (N), silicon (Si), carbon (C) or oxygen (O) may be included in the first phase-change film 120.

The first phase-change film 120 may exist in a crystalline state, an amorphous state, or a melt state, by heat generated by the first lower electrode 110 and the first intermediate electrode 130, in order to store information depending on these states.

The first intermediate electrode 130 may be on the first phase-change film 120. The first intermediate electrode 130 may be on the top surface of the first phase-change film 120. The first intermediate electrode 130 may be in direct contact with the top surface of the first phase-change film 120. The first intermediate electrode 130 may include a conductor. For example, the first intermediate electrode 130 may include, but is not limited to, at least one of W, Ti, Al, Cu, C, CN, TiN, TiAlN, TiSiN, TiCN, WN, CoSiN, WSiN, TaN, TaCN, and TaSiN.

According to some exemplary embodiments, the first intermediate electrode 130 may have a different composition from the first lower electrode 110. For example, the first intermediate electrode 130 may include a material having lower resistivity than the first lower electrode 110.

The bottom surface of the first intermediate electrode 130 may be in contact with the first phase-change film 120. The top surface of the first intermediate electrode 130 may be in contact with the first OTS (ovonic threshold switch) 140. At this time, if excessive heat is generated from the first intermediate electrode 130 and is transferred to the first OTS 140, the switching performance of the first OTS 140 may be deteriorated. When this happens, operation performance of the semiconductor device may be adversely affected.

Accordingly, the first intermediate electrode 130 includes a material having a resistivity lower than the first lower electrode 110. As a result, heat generated from the first intermediate electrode 130 during a write operation of the first memory cell MC1 is not transferred to the first OTS 140. The first intermediate electrode 130 may include a material having a resistivity, for example, of 1 mΩ·cm or less. When the first intermediate electrode 130 includes TiSiN as an electrode material, the concentration of Si contained therein may be 5 at. % or less.

The first mold film 10 may be on the first word line WL1 and the lower mold film 15. The first mold film 10 may surround the first lower electrode 110, the first phase-change film 120, and the first intermediate electrode 130. The top surface of the first mold film 10 may be flush with the top surface of the first intermediate electrode 130. The first mold film 10 may include an insulating film, e.g., at least one of SiN, $SiO_2$, and Si.

The first OTS 140 may be on the first intermediate electrode 130. The first OTS 140 may be between the first intermediate electrode 130 and the first upper electrode 150. The bottom surface of the first OTS 140 may be in direct contact with the first intermediate electrode 130. The top surface of the first OTS 140 may be in direct contact with the first upper electrode 150.

The first OTS 140 may include a chalcogenide compound. The first OTS 140 may change the state of the first phase-change film 120 between amorphous and crystalline states as it is turned on and off. The first OTS 140 may change the state of the first phase-change film 120 according to the voltage applied to the first phase-change film 120. Accordingly, the first OTS 140 may serve as a switch of the first memory cell MC1. For example, the first OTS 140 may switch the states of the first phase-change film 120 based on whether the current passing through the first OTS 140 exceeds the threshold current or whether the voltage across the first OTS 140 exceeds the threshold voltage.

The first upper electrode 150 may be on the first OTS 140 and between the first bit line BL1 and the first OTS 140. Accordingly, the bottom surface of the first upper electrode 150 may be in direct contact with the top surface of the first OTS 140. The top surface of the first upper electrode 150 may be in direct contact with the top surface of the first bit line BL1. The first upper electrode 150 may include a conductor. For example, the first upper electrode 150 may include, but is not limited to, at least one of W, Ti, Al, Cu, C, CN, TiN, TiAlN, TiSiN, TiCN, WN, CoSiN, WSiN, TaN, TaCN, and TaSiN.

According to some exemplary embodiments, the first upper electrode 150 may have a different composition from the first lower electrode 110. For example, the first upper electrode 150 may include a material having lower resistivity than the first lower electrode 110.

The bottom surface of the first upper electrode 150 may be in contact with the first OTS 140. If excessive heat is generated from the first upper electrode 150 and is transferred to the first OTS 140 like the first intermediate electrode 130, switching performance of the first OTS 140 may be deteriorated, and thus operation performance of the semiconductor device may be degraded.

Accordingly, the first upper electrode 150 includes a material having a resistivity lower than the first lower electrode 110. As a result, heat generated from the first upper electrode 150 during a write operation of the first memory cell MC1 is not transferred to the first OTS 140. The first upper electrode 150 may include a material having, for example, a resistivity of 1 mΩ·cm or less. When the first upper electrode 150 includes TiSiN as an electrode material, the concentration of Si contained therein may be 5 at. % or less.

The second mold film 20 may be on the first mold film 15 and may surround the first OTS 140 and the first upper electrode 150. The top surface of the first mold film 10 may be flush with the top surface of the first upper electrode 150. The second mold film 20 may include an insulating film, e.g., at least one of SiN, $SiO_2$, and Si.

The second memory cell MC2 may be spaced apart from the first memory cell MC1. For example, the second memory cell MC2 may be spaced apart from the first memory cell MC1 in the first direction D1.

The second memory cell MC2 may include a second lower electrode 210, a second phase-change film 220, a second intermediate electrode 230, a second OTS 240 and a second upper electrode 250 sequentially stacked between the first word line WL1 and the second bit line BL2. The second lower electrode 210 may be substantially identical to the first lower electrode 110. The second lower electrode 210 may be formed integrally with the first lower electrode 110. Accordingly, the second lower electrode 210 may include a material having a resistivity in the range of 1 to 30 mΩ·cm, like the first lower electrode 110.

As shown in FIG. 2, the first lower electrode 110 may be connected to the second lower electrode 210 via a first connection electrode 51. The first connection electrode 51 may include substantially the same material as the first lower electrode 110 and the second lower electrode 210. The first connection electrode 51 may be formed integrally with the first lower electrode 110 and the second lower electrode 210. In other implementations, the first connection electrode 51 may be removed unlike the one shown in FIG. 2.

A first spacer 160 may be formed along the profile of the first lower electrode 110, the second lower electrode 210, and the first connection electrode 51. The first spacer 160 may be between the first mold film 10 and the structure formed of the first lower electrode 210, the second lower electrode 210, and the first connection electrode 51. The first spacer 160 may include an insulating layer made of, for example, $SiO_2$. According to some exemplary embodiments, when the first connection electrode 51 is not formed, the first spacer 160 may be between the first lower electrode 110 and the first mold film 10 and between the second lower electrode 210 and first mold film 10.

The second phase-change film 220, the second intermediate electrode 230, the second OTS 240, and the second upper electrode 250 in the second memory cell MC2 may be substantially identical to the first phase-change film 120, the first intermediate electrode 130, the first OTS 140, and the first upper electrode 150 in the first memory cell MC1, respectively.

The third memory cell MC3 may be spaced apart from the second memory cell MC2. For example, the third memory cell MC3 is formed spaced apart from the second memory cell MC2 in the first direction D1 and between the second memory cell MC2 and the fourth memory cell MC4.

The third memory cell MC3 may include the third lower electrode 310, the third phase-change film 320, the third intermediate electrode 330, the third OTS 340, and the third upper electrode 350 sequentially stacked between the first word line WL1 and the third bit line BL3.

The third lower electrode 310, the third phase-change film 320, the third intermediate electrode 330, the third OTS 340, and the third upper electrode 350 in the third memory cell MC3 may be substantially identical to the first lower electrode 110, the first phase-change film 120, the first intermediate electrode 130, the first OTS 140, and the first upper electrode 150 in the first memory cell MC1, respectively.

The third memory cell MC3 may include the third lower electrode 310, the third phase-change film 320, the third intermediate electrode 330, the third OTS 340, and the third upper electrode 350 sequentially stacked between the first word line WL1 and the third bit line BL3.

The fourth memory cell MC4 may be spaced apart from the third memory cell MC3. For example, the fourth memory cell MC4 may be spaced apart from the third memory cell MC3 in the first direction D1.

The fourth lower electrode 410, the fourth phase-change film 420, the fourth intermediate electrode 430, the fourth OTS 440, and the fourth upper electrode 450 in the fourth memory cell MC4 may be substantially identical to the first lower electrode 110, the first phase-change film 120, the first intermediate electrode 130, the first OTS 140, and the first upper electrode 150 in the first memory cell MC1, respectively.

The fifth memory cell MC5, the ninth memory cell MC9 and the thirteenth memory cell MC13 shown in FIG. 3 may be spaced apart from one another in parallel in the second direction D2 from the first memory cell MC1. The fifth memory cell MC5 may include a fifth lower electrode 510, a fifth phase-change film 520, a fifth intermediate electrode 530, a fifth OTS 540, and a fifth upper electrode 550. The ninth memory cell MC9 may include a ninth lower electrode 610, a ninth phase-change film 620, a ninth intermediate electrode 630, a ninth OTS 640, and a ninth upper electrode 650. The thirteenth memory cell MC13 may include a thirteenth lower electrode 710, a thirteenth phase-change film 720, a thirteenth intermediate electrode 730, a thirteenth OTS 740, and a thirteenth upper electrode 750.

The elements in each of the fifth memory cell MC5, the ninth memory cell MC9 and the thirteenth memory cell MC13 may be formed substantially identical to the first lower electrode 110, the first phase-change film 120, the first intermediate electrode 130, the first OTS 140, and the first upper electrode 150, respectively. In another embodiment, one or more of these elements may be different.

The sixth to eighth memory cells MC6 to MC8, the tenth to twelfth memory cells MC10 to MC12, and the fourteenth to sixteenth memory cells MC14 to MC16 may have the same structure as the cell MC1. In another embodiment, these memory cells may have a different structure.

Figure 6:
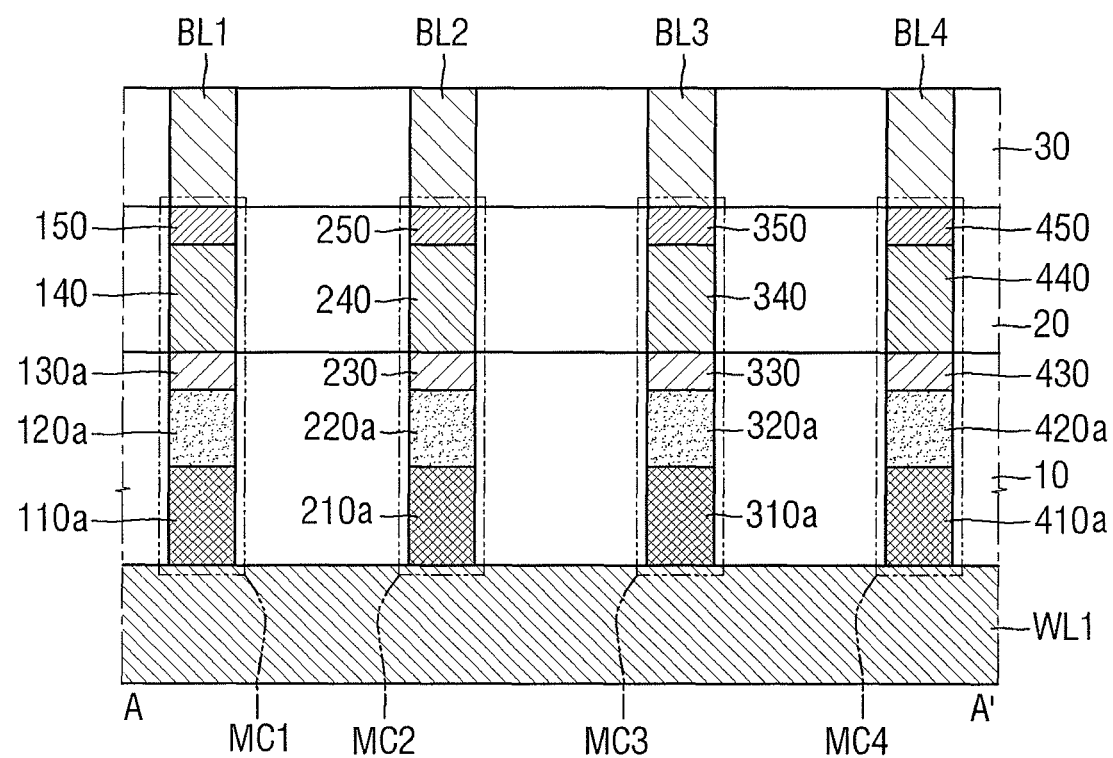
FIG. 6 illustrates another embodiment of a semiconductor device along section line A-A'.
Figure 7:
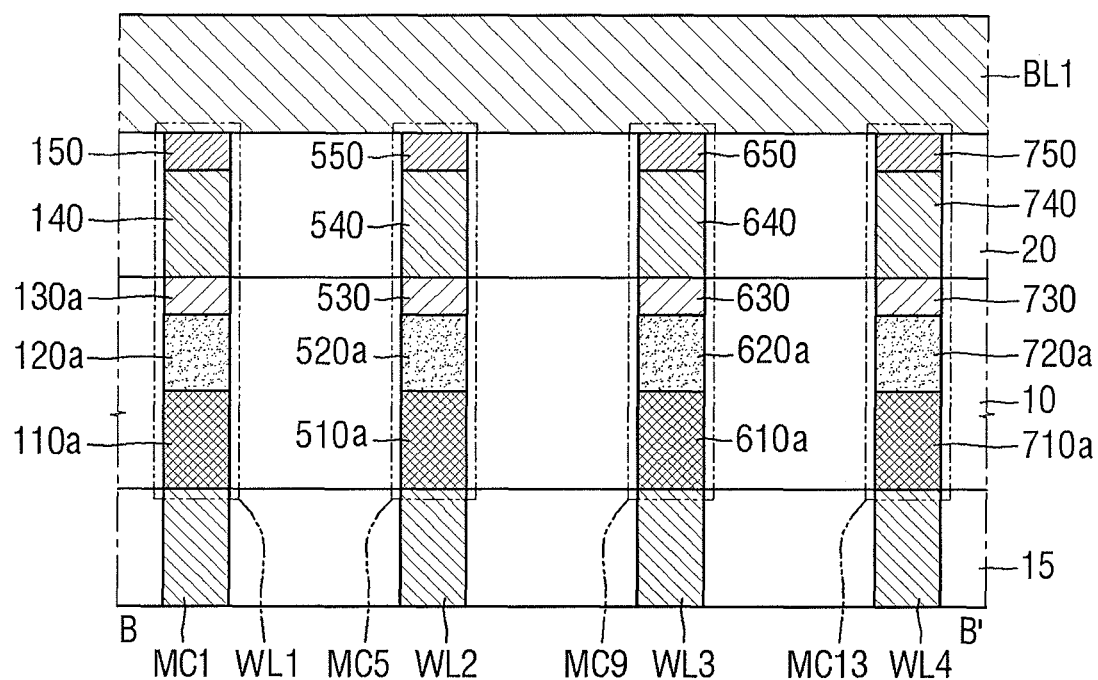
FIG. 7 illustrates another embodiment of a semiconductor device along section line B-B'.
Figure 7:
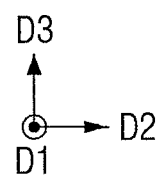

FIG. 6 illustrates a cross-sectional view of another embodiment of a semiconductor device taken along line A-A' in FIG. 1. FIG. 7 illustrates a cross-sectional view of another embodiment of a semiconductor device taken along line B-B' in FIG. 1.

Referring to FIGS. 6 and 7, this semiconductor device is different from the semiconductor device of the previous embodiment in that a first lower electrode 110a, a first phase-change film 120a, and a first intermediate electrode 130a have different shapes. For example, the first lower electrode 110a, the first phase-change film 120a and the first intermediate electrode 130a may have the same width in the first direction D1 as the first OTS 140 and the first upper electrode 150.

The first lower electrode 110a may be formed in a different manner from the first lower electrode 110 shown in FIG. 2, which is formed by forming a trench and filling the trench with a conductive material. For example, in one embodiment, the first lower electrode 110a may be formed by forming a trench T in a structure in which a plurality of material films are stacked on one another. Accordingly, the first lower electrode 110a, the first phase-change film 120a, and the first intermediate electrode 130a may have the same width in the first direction D1 as the first OTS 140 and the first upper electrode 150.

Likewise, the first lower electrode 110a, the first phase-change film 120a and the first intermediate electrode 130a may have the same width in the second direction D2 as the first OTS 140 and the first upper electrode 150.

Although the first lower electrode 110a has a different shape from the lower electrode 110 in the above-described embodiment, they may include one or more of the same composition materials. For example, the first lower electrode 110a may have a resistivity in the range of 1 to 30 mΩ·cm, and the concentration of Si may range from 5 to 55 at. % when the first lower electrode 110a contains TiSiN.

Likewise, the lower electrodes included in each of the second to fourth memory cells MC2 to MC4 may also have a resistivity in the range of 1 to 30 mΩ·cm, and the concentration of Si may range from 5 to 55 at. % when TiSiN is in each of the lower electrodes.

According to some exemplary embodiments, the semiconductor device may not include the spacers 160 and 260 shown in FIG. 2 In this case, the entire bottom surface of the first phase-change film 120a may be in contact with the entire top surface of the first lower electrode 110a.

Figure 8:
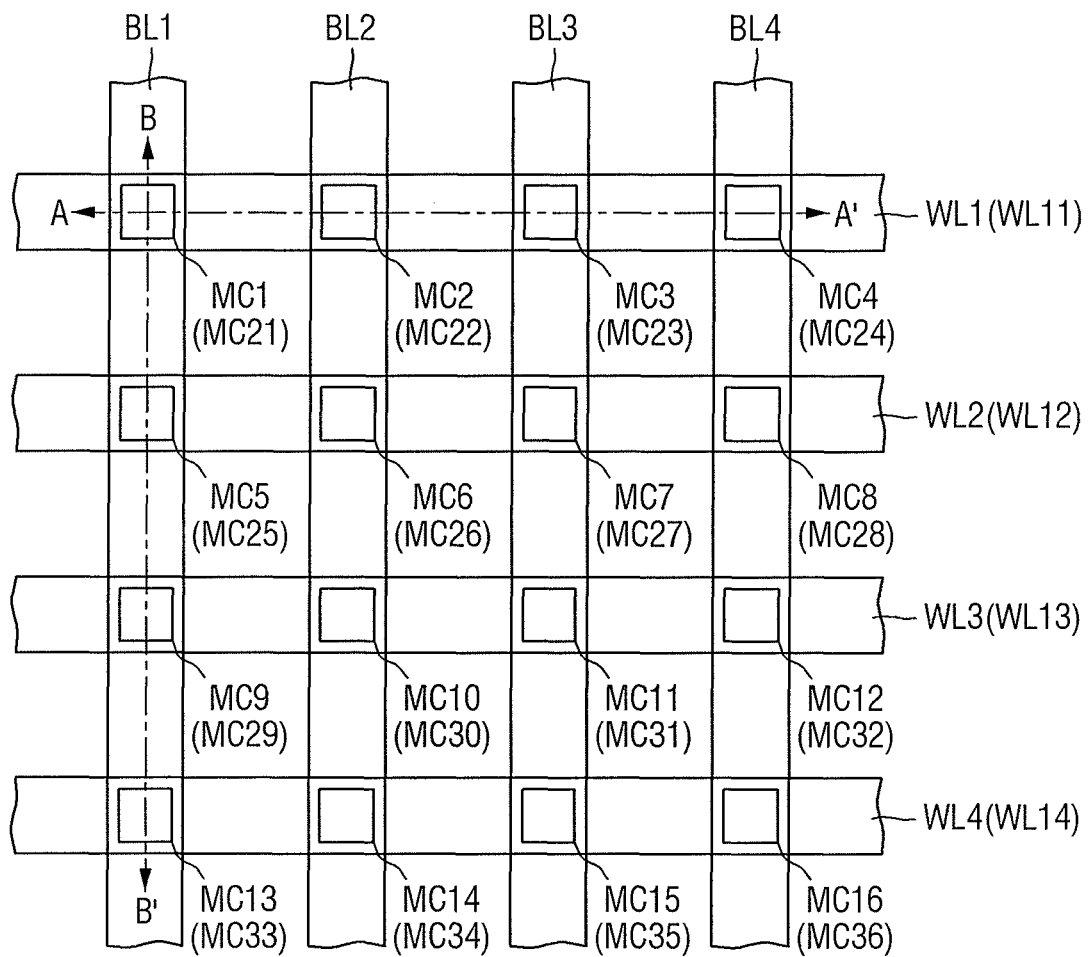
FIG. 8 illustrates another embodiment of a semiconductor device.
Figure 9:
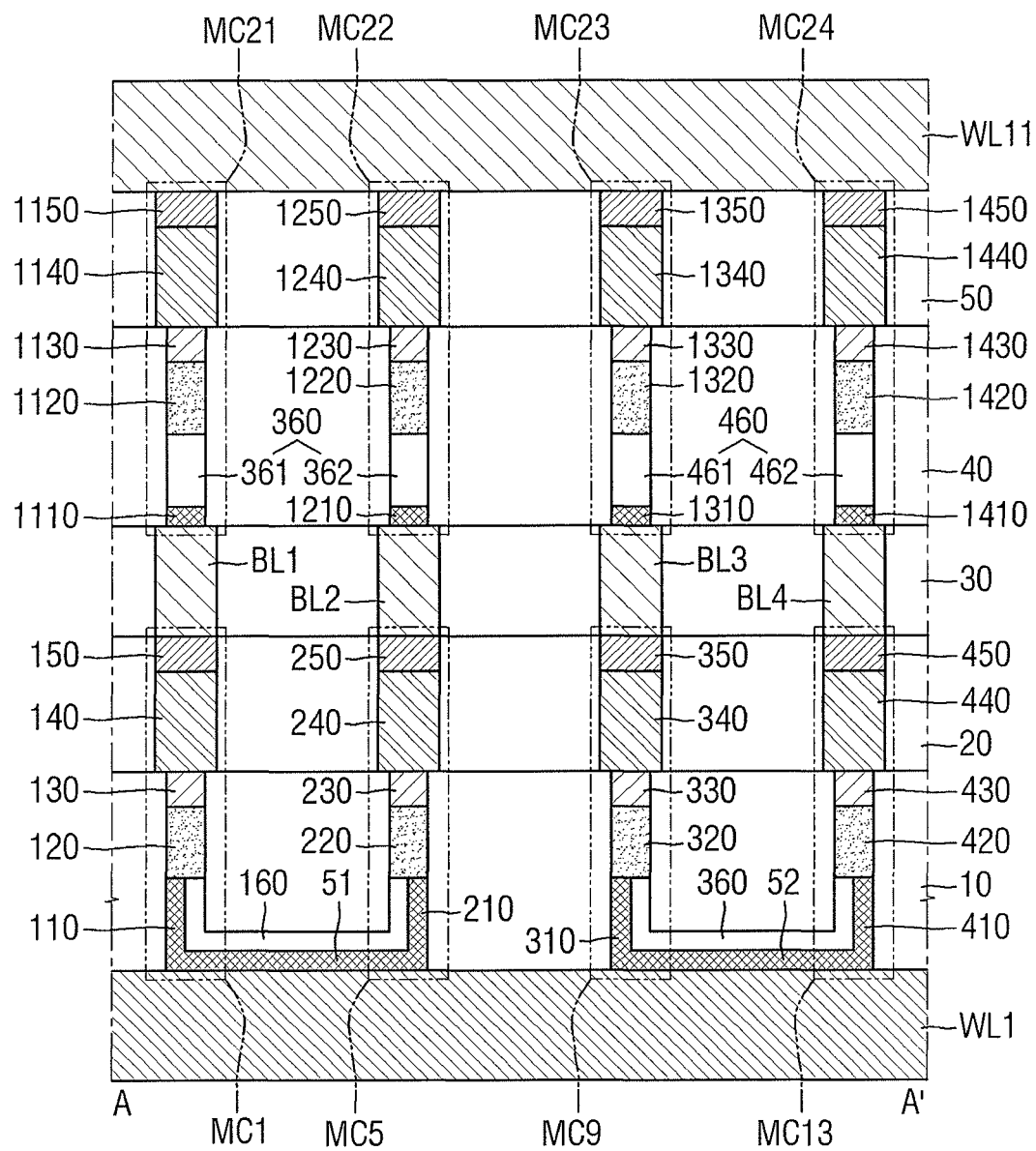
FIG. 9 illustrates an embodiment of a semiconductor device along section line A-A' in FIG. 8.
Figure 9:
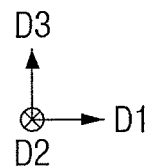
Figure 10:
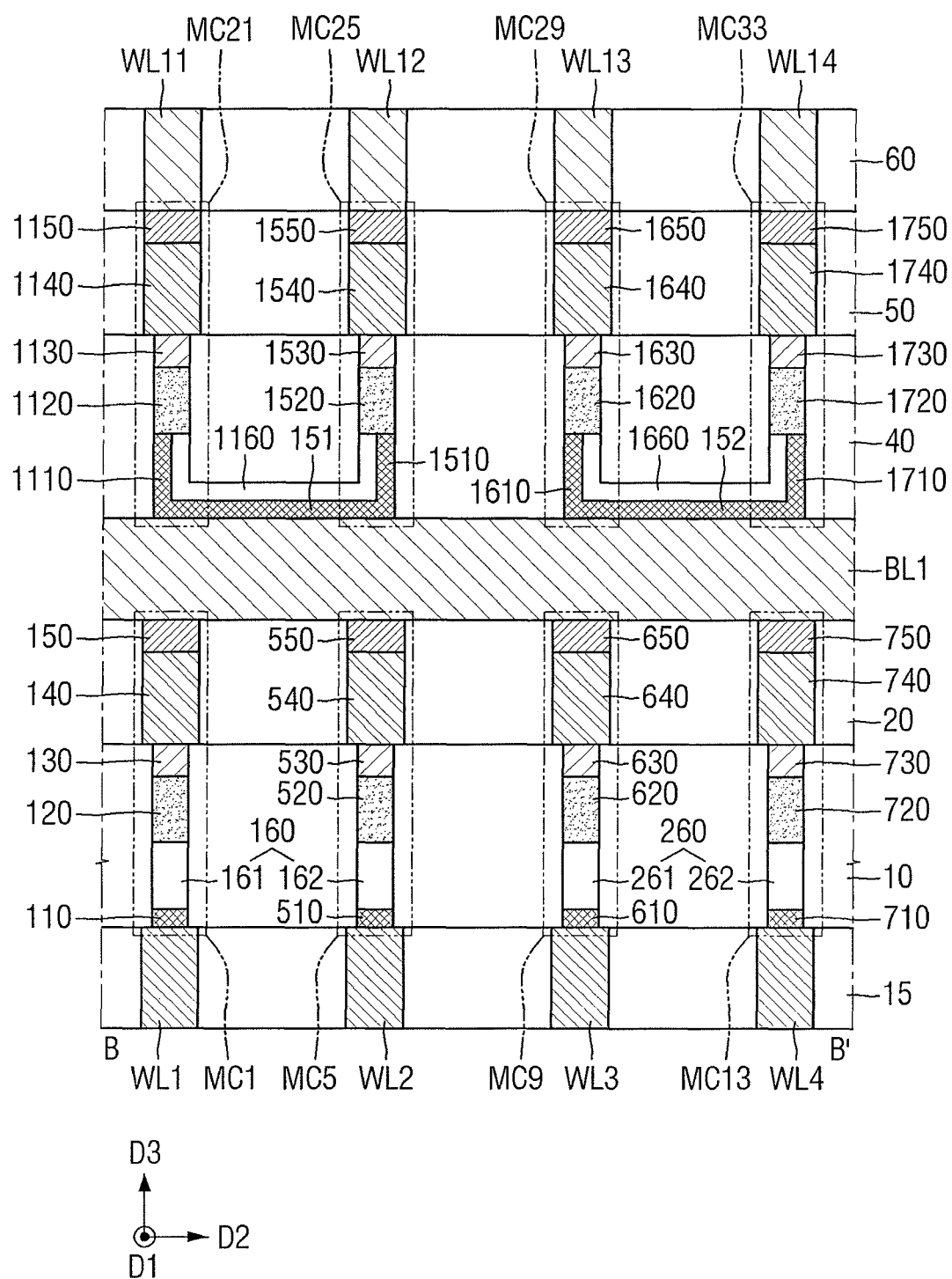
FIG. 10 illustrates an embodiment of a semiconductor device along section line B-B' of FIG. 9.

FIG. 8 illustrates another layout embodiment of a semiconductor device. FIG. 9 illustrates a cross-sectional view taken along the line A-A' in FIG. 8. FIG. 10 illustrates a cross-sectional view taken along line B-B' in FIG. 8.

Referring to FIGS. 8 to 10, this semiconductor device may have a two-stack structure including two memory cells overlapping each other in a third direction D3. For example, a twenty-first memory cell MC21 may be on the first memory cell MC1, a twenty-second memory cell MC22 may be on the second memory cell MC2, a twenty-third memory cell MC23 may be on the third memory cell MC3, and a twenty-fourth memory cell MC24 may be on the fourth memory cell MC4. Likewise, twenty-fifth to thirty-sixth memory cells MC25 to MC36 may be formed on the fifth to sixteenth memory cells MC5 to MC16, respectively.

The semiconductor device according to some exemplary embodiments may include the eleventh to fourteenth word lines WL11 to WL14 overlapping with the first to fourth word lines WL1 to WL4, respectively, in the third direction D3. The eleventh to fourteenth word lines WL11 to WL14 may extend in parallel in the first direction D1. The eleventh to fourteenth word lines WL11 to WL14 may be spaced apart from one another in the second direction D2.

The eleventh to fourteenth word lines WL11 to WL14 may be in parallel and at the same height level. For example, the twelfth word line WL12 may be between the eleventh word line WL11 and the thirteenth word line WL13. The thirteenth word line WL13 may be between the twelfth word line WL12 and the fourteenth word line WL14. The eleventh to fourteenth word lines WL11 to WL14 may be at a higher level than the first to fourth word lines WL1 to WL4. For example, the first to fourth word lines WL1 to WL4 may be spaced apart from the eleventh to fourteenth word lines WL1 to WL14 in the third direction D3.

As shown in FIG. 8, the first to fourth word lines WL1 to WL4 and the eleventh to fourteenth word lines WL11 to WL14 may overlap one another completely in the third direction D3. The eleventh to fourteenth word lines WL11 to WL14 may include conductors. The eleventh to fourteenth word lines WL11 to WL14 may include, but is not limited to, a metal such as tungsten (W), platinum (Pt), palladium (Pd), rhodium (Rh), ruthenium (Ru), iridium (Ir), copper (Cu), aluminum (Al), titanium (Ti), or tantalum (Ta).

The first to fourth bit lines BL1 to BL4 may be between the first to fourth word lines WL1 to WL4 and the eleventh to fourteenth word lines WL11 to WL14. The first to fourth bit lines BL1 to BL4 may be formed a mesh structure together with the first to fourth word lines WL1 to WL4 and the eleventh to fourteenth word lines WL11 to WL14 when viewed from above.

The twenty-first memory cell MC21 may be between the eleventh word line WL11 and the first bit line BL1. The twenty-first memory cell MC21 may include an eleventh lower electrode 1110, an eleventh phase-change film 1120, an eleventh intermediate electrode 1130, an eleventh OTS 1140, and an eleventh upper electrode 1150.

The twenty-first memory cell MC21 may have the same structure as the first memory cell MC1. For example, the eleventh lower electrode 1110, the eleventh phase-change film 1120, the eleventh intermediate electrode 1130, the eleventh OTS 1140, and the eleventh upper electrode 1150 in the twenty-first memory cell MC21 may correspond to the first lower electrode 110, the first phase-change film 120, the first intermediate electrode 130, the first OTS 140, and the first upper electrode 150, respectively.

This feature may also be applied to the components in each of the twenty-second memory cell MC22 to the thirty-sixth memory cell MC36. Accordingly, the components in each of the twenty-second memory cells MC22 to the thirty-sixth memory cell MC36 may correspond to the first lower electrode 110, the first phase-change film 120, the first intermediate electrode 130, the first OTS 140, and the first upper electrode 150 in the first memory cell MC1, respectively.

Each of the twenty-first memory cell MC22 to the thirty-sixth memory cells MC36 may be surrounded by the third mold film 40 and the fourth mold film 50. The third mold film 40 and the fourth mold film 50 may have the structures corresponding to the first mold film 10 and the second mold film 20, respectively. Accordingly, the third mold film 40 and the fourth mold film 50 may include an insulative material.

In addition, another upper mold film 60 may be formed at the spaces between the eleventh to fourteenth word lines WL11 to WL14 and may surround the eleventh to fourteenth word lines WL11 to WL14.

The eleventh lower electrode 1110 in the twenty-first memory cell MC21 may have a composition similar to the lower electrodes (for example, the lower electrode 110) in the semiconductor devices according to the above-described embodiments. Accordingly, it may have a resistivity in the range from 1 to 30 mΩ·cm, and when the first lower electrode 110a includes TiSiN, the concentration of Si may range from 5 to 55 at. %.

FIGS. 11 to 18 illustrate cross-sectional views of stages of an embodiment of a method for fabricating a semiconductor device, which, for example, may be the semiconductor device described above with respect to FIGS. 1 to 3.

Figure 11:
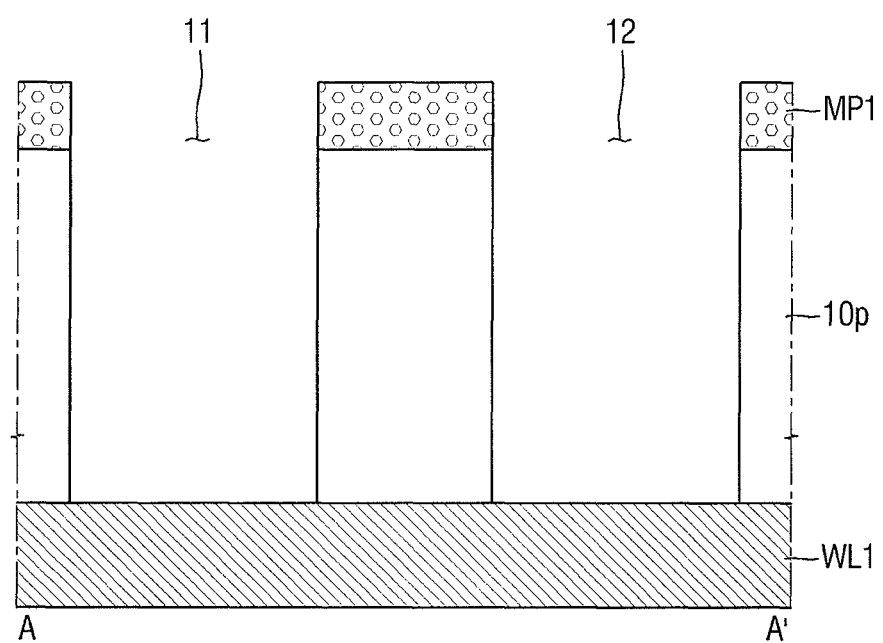
FIGS. 11 to 18 illustrate stages of an embodiment of a method for fabricating a semiconductor device.

Referring to FIG. 11, a first mold film pattern 10p is formed on a first word line WL1. Forming the first mold film pattern 10p may include forming a mold film on the first word line WL1 and using a first mask pattern MP1 as a mask to form the first and second trenches 11 and 12 in the mold film. The first mold film pattern 10p may include one of SiN, $SiO_2$, and Si, for example. The first mold film pattern 10p may include a material having a different etch selectivity from that of the first mask pattern MP1.

The first trench 11 and the second trench 12 may extend in the second direction D2 and may extend in the same direction as the first to fourth bit lines BL1 to BL4 shown in FIG. 2. The second to fourth word lines WL2 to WL4, which are spaced apart from the first word line WL1 in the second direction D2, may be formed together.

Figure 12:
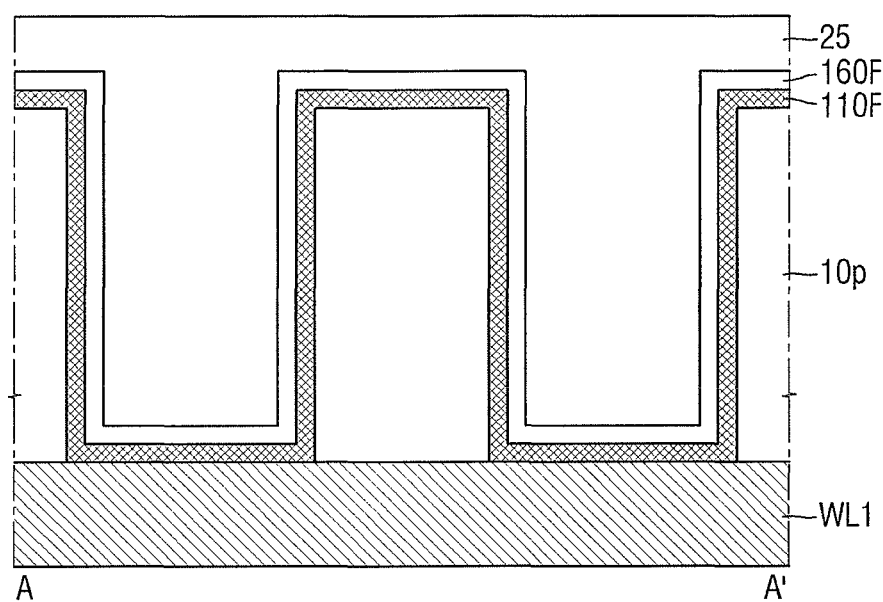
Figure 12:
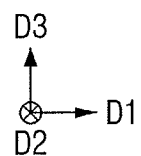

Referring to FIG. 12, the first mask pattern MP1 is removed, a lower electrode film 110F and a spacer film 160F are formed, and a sacrificial film 25 is formed on the spacer film 160F. The lower electrode film 110F may include, but is not limited to, at least one of W, Ti, Al, Cu, C, CN, TiN, TiAlN, TiSiN, TiCN, WN, CoSiN, WSiN, TaN, TaCN, and TaSiN.

The lower electrode film 110F may be formed conformally on the inner walls of the first trench 11 and the second trench 12.

The spacer film 160F may include, but is not limited to, $SiO_2$. In other implementations, the spacer film 160F may include a different material from the mold film pattern 10p or the sacrificial film 25.

The sacrificial film 25 may include at least one of SiN, $SiO_2$ and Si, for example, and may be used to completely fill the first trench 11 and the second trench 11, which are at least partially filled with the lower electrode film 110F and the spacer film 160F. In some exemplary embodiments, the level of the top surface of the sacrificial film 25 may be higher than the level of the top surface of the first mold film pattern 10p.

Figure 13:
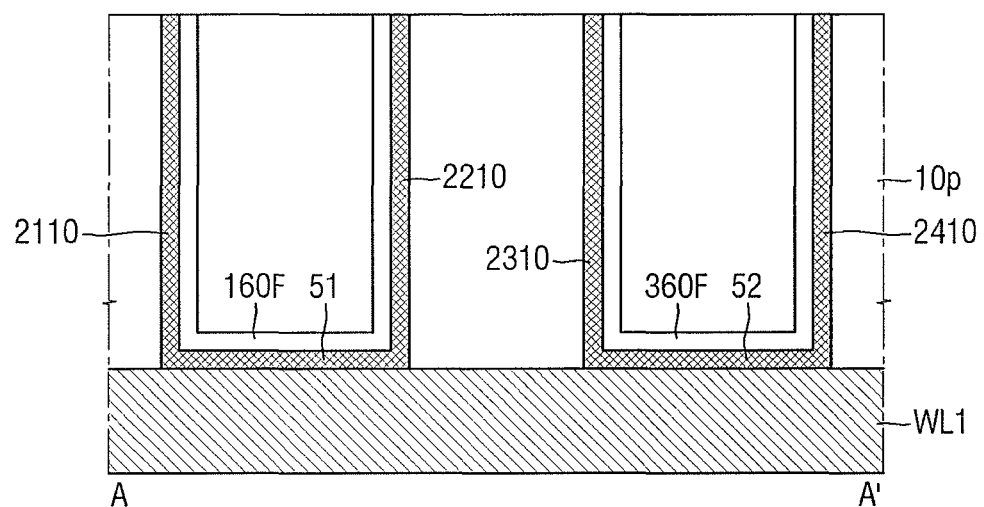
Figure 13:
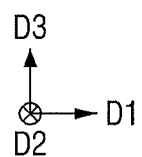

Referring to FIG. 13, the sacrificial film 25, the lower electrode film 110F, and the spacer film 160F are partially removed, such that the mask pattern 10p is exposed. The sacrificial film 25, the lower electrode film 110F, and the spacer film 160F may be partially removed, for example, by a planarization process. The planarization process may be, but is not limited to, chemical mechanical polish (CMP).

The planarization process may expose the first mold film pattern 10p. A first pre-lower electrode 2110, a second pre-lower electrode 2210, a third pre-lower electrode 2310, and a fourth pre-lower electrode 2410. The top surfaces of the first to fourth pre-lower electrodes 2110 to 2410 may be exposed by the first mold film pattern 10p. The top surface of the spacer film 160F may also be exposed by the first mold film pattern 10p.

Figure 14:
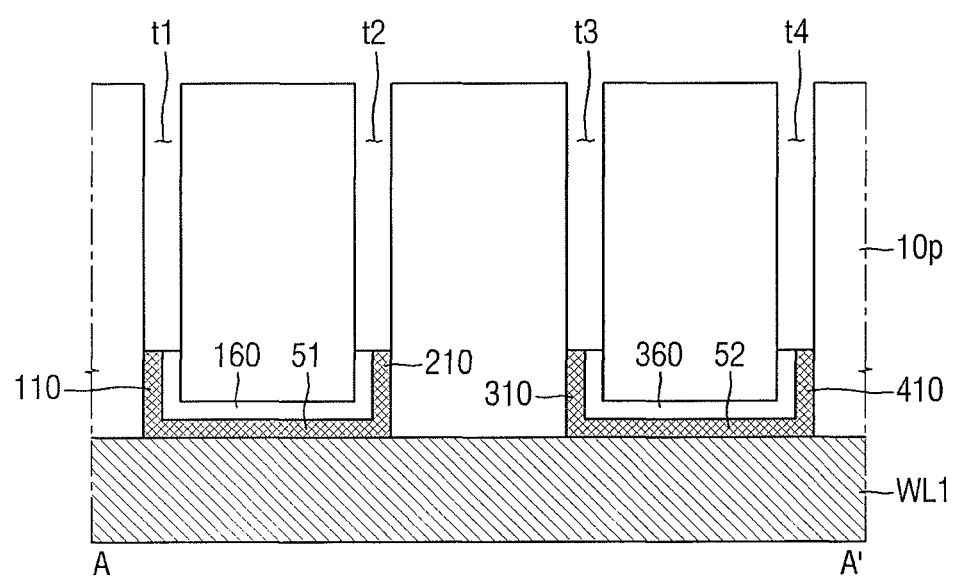
Figure 14:
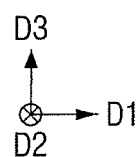

Subsequently, referring to FIG. 14, the exposed first to fourth pre-lower electrodes 2110 to 2410 are partially removed, to form first to fourth lower electrodes 110 to 410. In addition, the exposed spacer film 160F is partially removed to form the first spacer 160 and the second spacer 360.

Trenches may be formed that extend in the first direction D1 to form the first spacer 160 and the second spacer 360. For example, as shown in FIG. 3, the first spacer 160 may be formed of patterns 161 and 162 spaced apart from each other in the second direction D2. Accordingly, in order to form the first spacer 360 and the second spacer 360 spaced apart from each other in the second direction D2, a plurality of trenches extending in the first direction D1 may be formed.

The first spacer 160 or the first lower electrode 110 may be formed, for example, by a wet etching process. In one embodiment, the first pre-lower electrode 2110 may be etched using an etchant having an etch selectivity with respect to the first pre-lower electrode 2110, to form the first lower electrode 110. In addition, the spacer film 160F may be etched, using an etchant having an etch selectivity with respect to the spacer film 160F, to form the first spacer 160.

By forming the spacers 160 and 360 and the first to fourth lower electrodes 110 to 410, trenches t1 to t4 may be formed between the first mold film patterns 10p.

Figure 15:
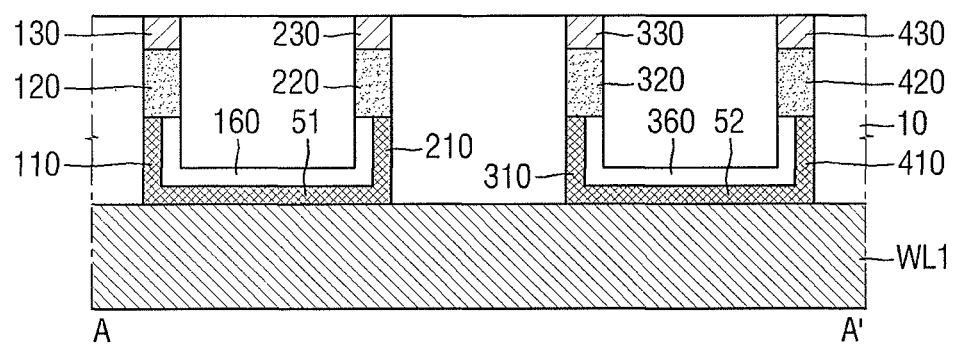
Figure 15:
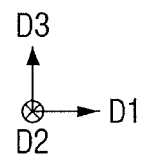

Subsequently, referring to FIG. 15, the first to fourth phase-change films 120 to 420 and the first to fourth intermediate electrodes 130 to 430 are sequentially stacked in each of the first to fourth trenches t1 to t4. In some embodiments, the first to fourth phase-change films 120 to 420 may include a variety of kinds of materials including, for example, binary compound such as GaSb, InSb, InSe, SbTe and GeTe, ternary compound such as GeTeAs, GeSbTe, GeBiTe, GaSeTe, SeTeSn, GeTeTi, InSbTe, SnSb$_2$Te$_4$ and InSbGe, and quaternary compound such as AgInSbTe, (GeSn)SbTe, GeSb(SeTe) and Te$_{81}$Ge$_{15}$Sb$_2$S$_2$. In addition, the above materials may be doped with nitrogen (N), silicon (Si), carbon (C) or oxygen (O), or another material to improve the semiconductor properties of the first to fourth phase-change films 120 to 140. For example, GeSbTe doped with nitrogen (N), silicon (Si), carbon (C) or oxygen (O) may be included in the first to fourth phase-change films 120 to 420.

In some embodiments, the first to fourth intermediate electrodes 130 to 430 may include, but is not limited to, at least one of W, Ti, Al, Cu, C, CN, TiN, TiAlN, TiSiN, TiCN, WN, CoSiN, WSiN, TaN, TaCN, and TaSiN.

In some embodiments, in order to form the first to fourth phase-change films 120 to 420 or the first to fourth intermediate electrodes 130 to 430, a seed layer is formed on the inner walls of the first to fourth trenches t1 to t4, and the seed film is plated to form a phase-change film or an intermediate electrode, for example.

After the first to fourth phase-change films 120 to 420 and the first to fourth intermediate electrodes 130 to 430 are stacked, the first mold film pattern 10p is removed by planarization, such that the first mold film 10 may be formed.

Figure 16:
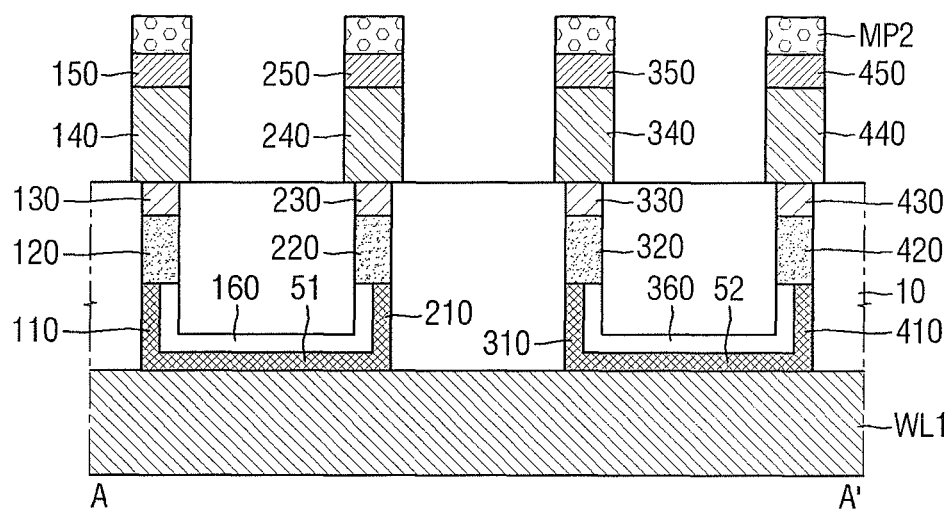

Referring to FIG. 16, the first OTS 140 may be stacked on the first intermediate electrode 130, and then the first upper electrode 150 may be stacked on the first OTS 140. Likewise, the second to fourth OTSs 240 to 440 may be stacked on the second to fourth intermediate electrodes 230 to 430, respectively. Then, the second to fourth upper electrodes 250 to 450 may be stacked on the second to fourth OTS 240 to 440, respectively.

The forming the first to fourth OTSs 140 to 440 and the first to fourth upper electrodes 150 to 450 may include forming an OTS film and an upper electrode film sequentially, and etching the OTS film and the upper electrode film using the second mask pattern MP2 as a mask. Each of the first to fourth OTSs 140 to 440 may include a chalcogenide compound. The first to fourth upper electrodes 150 to 450 may include, but is not limited to, at least one of W, Ti, Al, Cu, C, CN, TiN, TiAlN, TiSiN, TiCN, WN, CoSiN, WSiN, TaN, TaCN, and TaSiN.

Figure 17:
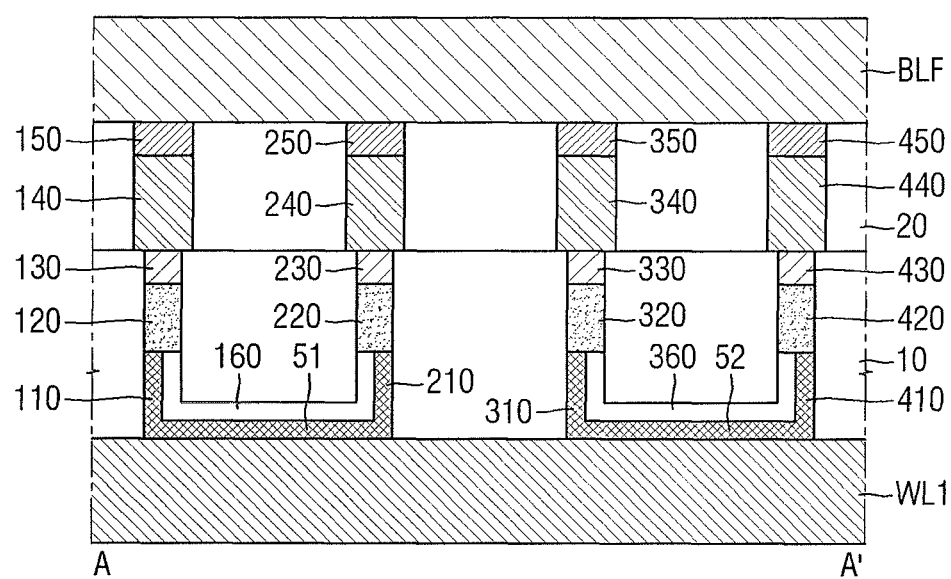

Subsequently, referring to FIG. 17, the second mask pattern MP2 is removed, a second mold film 20 is formed on the first mold film 10, and a bit line film BLF is formed on the second mold film 20. The second mold film 20 may include an insulative material such as SiN, SiO$_2$, and Si.

Figure 18:
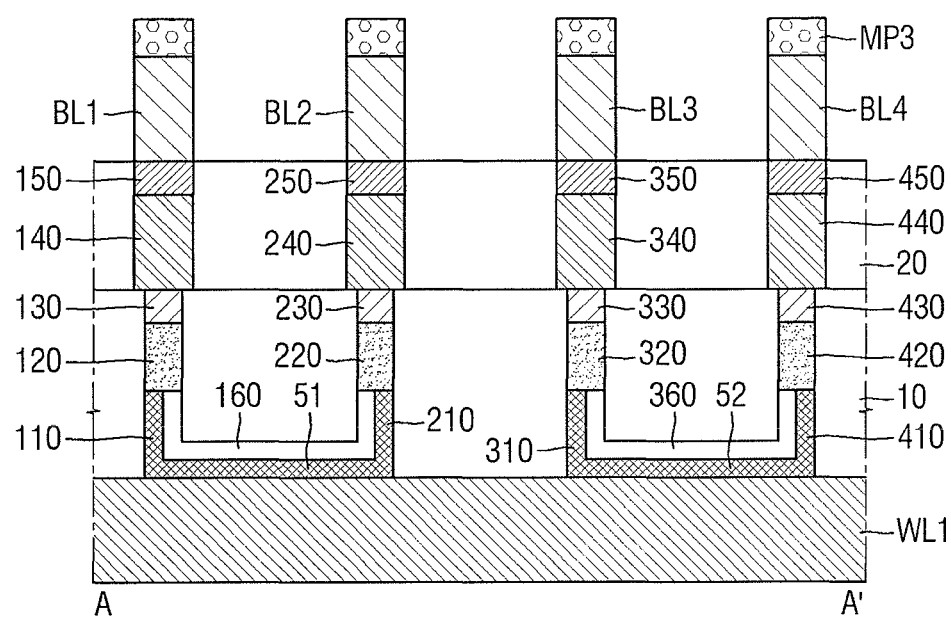

Referring to FIGS. 2 and 18, the first to fourth bit lines BL1 to BL4 extending in the second direction D2 are formed by etching the bit line film BLF using the third mask pattern MP3 as an etch mask. Subsequently, an upper mold film 30 is formed so as to isolate the first to fourth bit lines BL1 to BL4 from one another. The first to fourth bit lines BL1 to BL4 may include, but is not limited to, a conductive metal such as tungsten (W), platinum (Pt), palladium (Pd), rhodium (Rh), ruthenium (Ru), iridium (Ir), copper (Cu), aluminum (Al), titanium (Ti), and tantalum (Ta). The upper mold film 30 may include an insulative material such as SiN, SiO$_2$, and Si.

Figure 19:
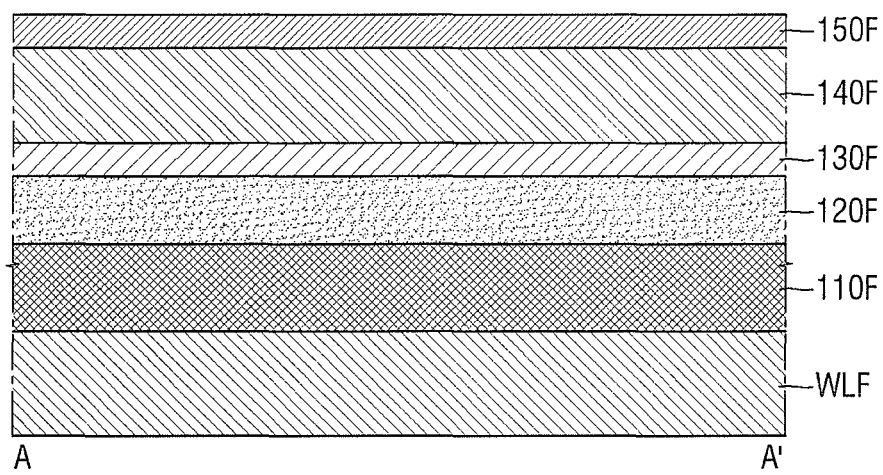
FIGS. 19 to 23 illustrate stages of another embodiment of a method for fabricating a semiconductor device.
Figure 19:
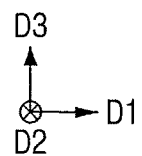
Figure 20:
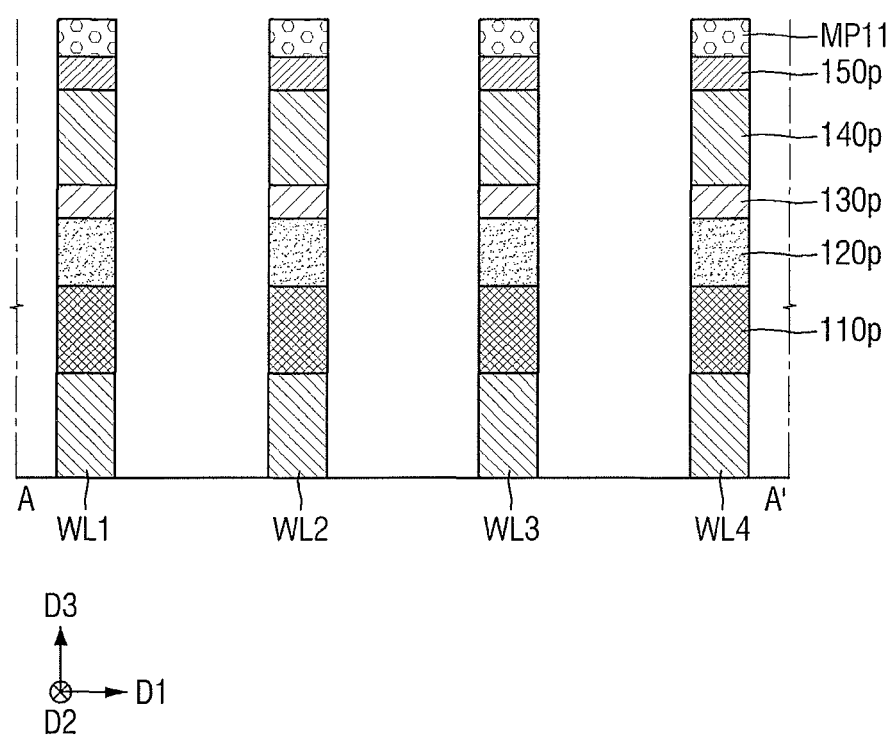
Figure 21:
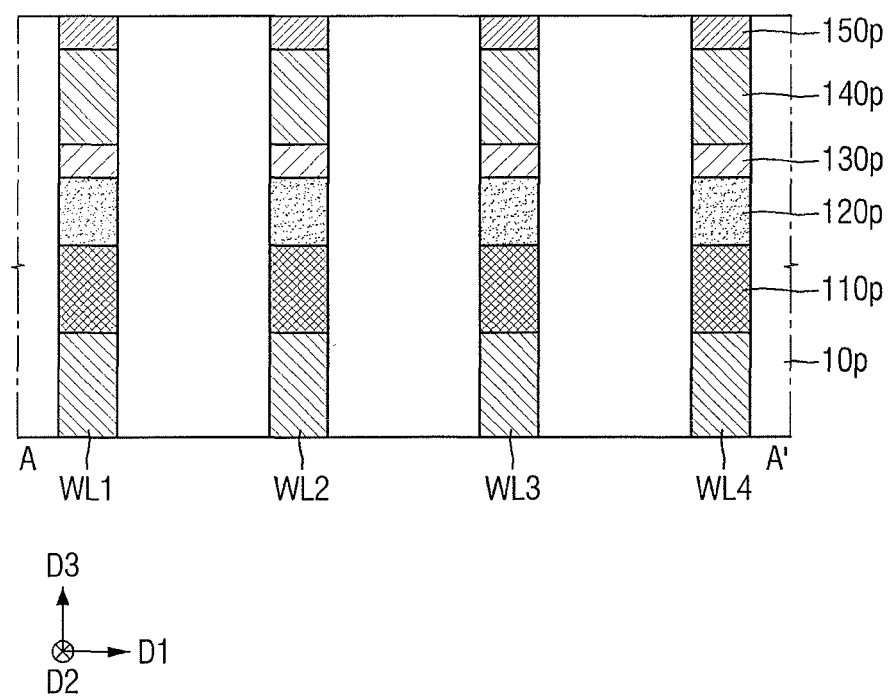
Figure 22:
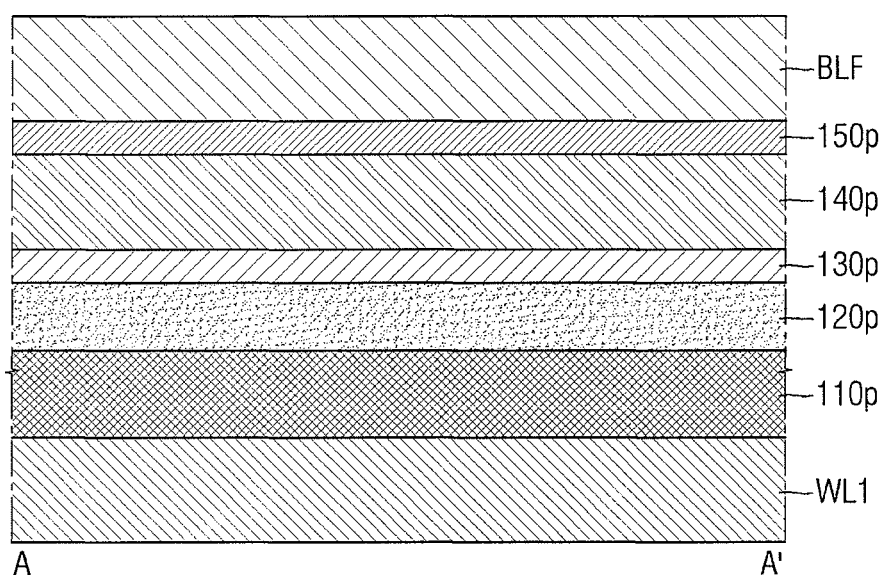
Figure 22:
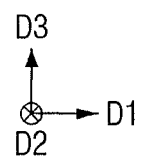
Figure 23:
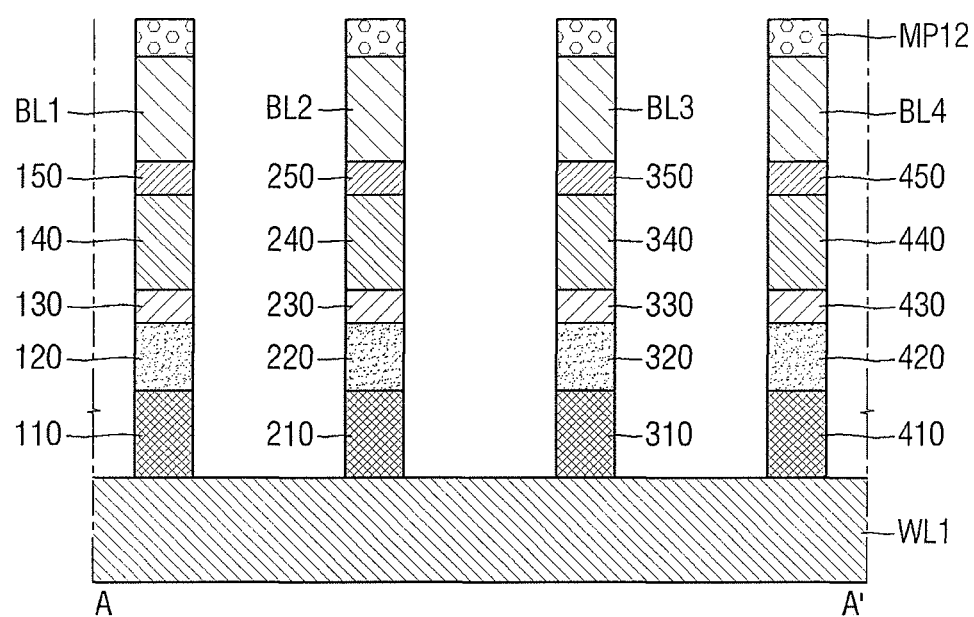
Figure 23:
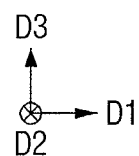

FIGS. 19 to 23 illustrate cross-sectional views of stages of another embodiment of a method for fabricating a semiconductor device, which, for example, may correspond to the semiconductor device described above with respect to FIGS. 1, 6, and 7. FIGS. 19 to 21 illustrate cross-sectional views taken along line B-B' in FIG. 1. FIGS. 22 and 23 are cross-sectional views taken along line A-A' in FIG. 1.

Referring to FIG. 19, a lower electrode film 110F, a phase-change film 120F, an intermediate electrode film 130F, an OTS film 140F, and an upper electrode film 150F are sequentially formed on a word line film WLF. The word line film WLF, the lower electrode film 110F, the phase-change film 120F, the intermediate electrode film 130F, the OTS film 140F, and the upper electrode film 150F may correspond to and have the same material with the first word line WL1, the first lower electrode 110, and the first phase-change film 120, the first intermediate electrode 130, the first OTS 140, and the first upper electrode 150, respectively.

Referring to FIG. 20, a word line film WLF, a lower electrode film 110F, a phase-change film 120F, an intermediate electrode film 130F, an OTS film 140F, and an upper electrode film 150F are etched using an eleventh mask film pattern MP11 extending in the first direction D1 as an etch mask. By forming the etching, the first to fourth word lines WL1 to WL4 extending the first direction D1, the first lower electrode pattern 110p, the first phase-change film pattern 120p, for first intermediate electrode pattern 130p, a first OTS pattern 140p, and a first upper electrode 150p may be formed.

Subsequently, referring to FIG. 21, the first mold film pattern 10p is formed to fill spaces between the first to fourth word lines WL1 to WL4, in the first lower electrode pattern 110p, in the first phase-change film pattern 120p, in the first intermediate electrode pattern 130p, in the first OTS pattern 140p, and in the first upper electrode pattern 150p, and the top surface of the upper electrode film 150p is exposed by a planarization process. A portion of the first mold film pattern 10p and the first mask film pattern MP11 may be removed by the planarization process.

Referring to FIGS. 22 and 23, a bit line film BLF is formed on the first mold film pattern 10p and the first to fourth upper electrode patterns 150p. A twelfth mask film pattern MP12 extending in the second direction is formed on the bit line film BLF. The first lower electrode pattern 110p, the first phase-change film pattern 120p, the first intermediate electrode pattern 130p, the first OTS pattern 140p, and the first upper electrode pattern 150p are etched using the twelfth mask film pattern MP12 as an etch mask. The first to fourth memory cells MC1 to MC4 are formed by this etching process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
   a first word line extending in a first direction;
   a first bit line extending in a second direction crossing the first direction and spaced apart from the first word line in a third direction crossing the first and second directions;
   a first memory cell that extends in the third direction between the first word line and the first bit line, wherein the first memory cell includes:
   a first lower electrode on the first word line, a first phase-change film on the first lower electrode,
a first intermediate electrode on the first phase-change film,
a first switch on the first intermediate electrode, and
a first upper electrode on the first switch, and wherein a resistivity of the first lower electrode ranges from about 1 to about 30 mΩ·cm;
a second memory cell that extends in the third direction between the first word line and a second bit line, the second memory cell including a second lower electrode, a second phase-change layer, a second switch, and a second upper electrode sequentially stacked from the first word line; and
a connection electrode connecting the first lower electrode with the second lower electrode and in contact with a top surface of the first word line.

2. The semiconductor device as claimed in claim 1, wherein the first lower electrode includes TiSiN.

3. The semiconductor device as claimed in claim 2, wherein the first lower electrode includes TiSiN with Si content of about 5 to about 55 at. %.

4. The semiconductor device as claimed in claim 1, wherein a resistivity of the first intermediate electrode is lower than the resistivity of the first lower electrode.

5. The semiconductor device as claimed in claim 4, wherein the resistivity of the first intermediate electrode is equal to or lower than about 1 mΩ·cm.

6. The semiconductor device as claimed in claim 1, further comprising:
a mold film filling a space between the first word line and the first bit line, the first memory cell being in the mold film,
wherein the second bit line is spaced apart from the first bit line in the first direction and extending in the second direction.

7. The semiconductor device as claimed in claim 6, wherein a resistivity of the second lower electrode ranges from about 1 to about 30 mΩ·cm.

8. The semiconductor device as claimed in claim 6, further comprising:
a spacer between the mold film and the first lower electrode, the second lower electrode, and the connection electrode.

9. The semiconductor device as claimed in claim 1, further comprising:
a second word line extending in parallel with the first word line above the first bit line; and
a third memory cell between the second word line and the first bit line and extending in the third direction, wherein the third memory cell includes a third upper electrode, a third switch, a third intermediate electrode, a third phase-change film, and a third lower electrode sequentially stacked on one another between the first bit line and the second word line.

10. The semiconductor device as claimed in claim 9, wherein a resistivity of the third lower electrode ranges from about 1 to about 30 mΩ·cm.

11. The semiconductor device as claimed in claim 1, wherein a width of the first phase-change film in the first direction is less than a width of the first switch in the first direction.

12. The semiconductor device as claimed in claim 1, wherein a width of the lower electrode in the first direction is equal to a width of the first switch in the first direction.

13. The semiconductor device as claimed in claim 1, wherein the first switch is an ovonic threshold switch.

14. The semiconductor device as claimed in claim 9, wherein the first memory cell and the third memory cell overlap each other in the vertical direction.

15. The semiconductor device as claimed in claim 9, wherein each of the first and third lower electrodes includes TiSiN with Si content of about 5 to about 55 at. %.

16. A semiconductor device, comprising:
a first word line extending in a first direction;
a first bit line extending in a second direction crossing the first direction and spaced apart from the first word line in a third direction crossing the first and second directions;
a second bit line at a same level with the first bit line and spaced apart from the first bit line in the first direction;
a first memory cell formed in the third direction between the first word line and the first bit line, wherein the first memory cell includes a first lower electrode on the first word line, a first phase-change film on the first lower electrode, a first intermediate electrode on the first phase-change film, a first switch on the first intermediate electrode, and a first upper electrode interposed between the first switch and the first bit line, wherein the first lower electrode comprises TiSiN with Si content of about 5 to about 55 at. %;
a second memory cell oriented in the third direction between the first word line and the second bit line, wherein the second memory cell includes a second lower electrode on the first word line, a second phase-change film on the second lower electrode, a second intermediate electrode on the second phase-change film, a second switch on the second intermediate electrode, and a second upper electrode between the second switch and the second bit line, wherein the second lower electrode includes TiSiN with Si content of about 5 to about 55 at. %; and
a connection electrode connecting the first lower electrode with the second lower electrode and in contact with a top surface of the first word line.

17. The semiconductor device as claimed in claim 16, further comprising:
a mold film filling space between the first word line and the first and second bit lines; and
a spacer between the mold film and the first lower electrode, the second lower electrode, and the connection electrode.

* * * * *